(12) United States Patent
Wang et al.

(10) Patent No.: US 10,782,318 B2
(45) Date of Patent: *Sep. 22, 2020

(54) TEST PROBING STRUCTURE

(71) Applicant: Taiwan Semiconductor Manufacturing Co., Ltd., Hsin-Chu (TW)

(72) Inventors: Mill-Jer Wang, Hsinchu (TW); Ching-Fang Chen, Taichung (TW); Sandeep Kumar Goel, Dublin, CA (US); Chung-Sheng Yuan, Hsinchu (TW); Chao-Yang Yeh, Luzhou (TW); Chin-Chou Liu, Jhubei (TW); Yun-Han Lee, Baoshan Township (TW); Hung-Chih Lin, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 305 days.

This patent is subject to a terminal disclaimer.

(21) Appl. No.: 15/789,338

(22) Filed: Oct. 20, 2017

(65) Prior Publication Data

US 2018/0038894 A1 Feb. 8, 2018

Related U.S. Application Data

(63) Continuation of application No. 13/313,228, filed on Dec. 7, 2011, now Pat. No. 9,817,029.

(51) Int. Cl.
*G01R 1/073* (2006.01)

(52) U.S. Cl.
CPC ..... *G01R 1/07342* (2013.01); *G01R 1/07378* (2013.01); *H01L 2224/16225* (2013.01)

(58) Field of Classification Search
CPC ............ G01R 1/07378; G01R 31/2889; G01R 1/06711; H01L 2924/15311; H01L 23/49816

See application file for complete search history.

(56) References Cited

U.S. PATENT DOCUMENTS

| | | | |
|---|---|---|---|
| 5,529,504 A | 6/1996 | Greenstein | |
| 5,786,701 A | 7/1998 | Pedder | |
| 6,379,982 B1 | 4/2002 | Ahn | |
| 6,676,438 B2 | 1/2004 | Zhou et al. | |
| 7,129,730 B2 | 10/2006 | Liu et al. | |

(Continued)

*Primary Examiner* — Son T Le
*Assistant Examiner* — Adam S Clarke
(74) *Attorney, Agent, or Firm* — Duane Morris LLP

(57) ABSTRACT

A testing probe structure for wafer level testing semiconductor IC packaged devices under test (DUT). The structure includes a substrate, through substrate vias, a bump array formed on a first surface of the substrate for engaging a probe card, and at least one probing unit on a second surface of the substrate. The probing unit includes a conductive probe pad formed on one surface of the substrate and at least one microbump interconnected to the pad. The pads are electrically coupled to the bump array through the vias. Some embodiments include a plurality of microbumps associated with the pad which are configured to engage a mating array of microbumps on the DUT. In some embodiments, the DUT may be probed by applying test signals from a probe card through the bump and microbump arrays without direct probing of the DUT microbumps.

20 Claims, 12 Drawing Sheets

(56) References Cited

U.S. PATENT DOCUMENTS

| | | |
|---|---|---|
| 7,733,102 B2 | 6/2010 | Cheng |
| 8,441,274 B2 | 5/2013 | Hamaguchi |
| 2006/0125498 A1 | 6/2006 | Liu et al. |
| 2010/0009473 A1 | 1/2010 | Mizoguchi |
| 2010/0246152 A1* | 9/2010 | Lin ........................ H01L 24/92 |
| | | 361/783 |
| 2011/0215360 A1* | 9/2011 | Wang ...................... H01L 33/62 |
| | | 257/99 |
| 2012/0126840 A1 | 5/2012 | Lee |
| 2012/0261662 A1 | 10/2012 | Liang et al. |
| 2014/0091826 A1* | 4/2014 | Chui .................. G01R 1/07378 |
| | | 324/756.03 |

\* cited by examiner

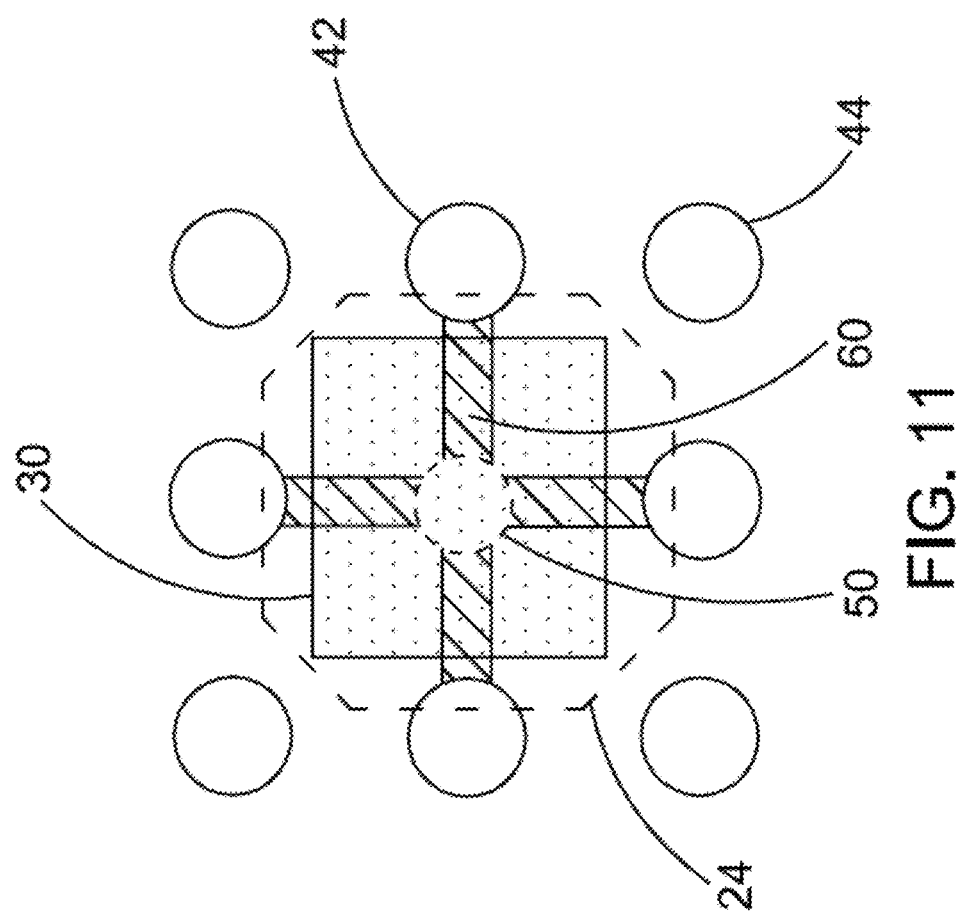

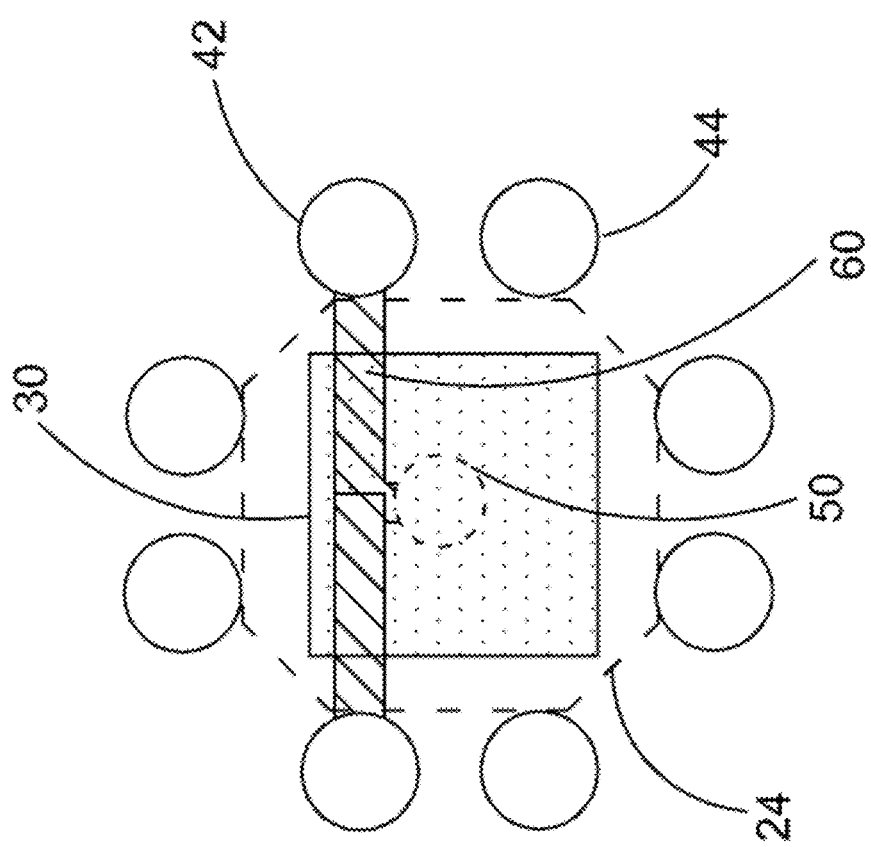

TEST PROBING STRUCTURE

PRIORITY CLAIM AND CROSS-REFERENCE

This application is a continuation of U.S. patent application Ser. No. 13/313,228, filed Dec. 7, 2011, which application is expressly incorporated by reference herein in its entirety.

TECHNICAL FIELD

The present disclosure generally relates to semiconductors, and more particularly to probing structures adapted for testing integrated circuit devices formed on a semiconductor wafer.

BACKGROUND

Modern semiconductor fabrication involves numerous steps including photolithography, material deposition, and etching to form a plurality of individual semiconductor devices or integrated circuit chips (dies or dice) on a single semiconductor silicon wafer. Some of the individual chips formed on the wafer, however, may have defects due to variances and problems that may arise during the intricate semiconductor fabrication process. Prior to wafer dicing wherein the individual integrated circuit dies are separated from the semiconductor wafer, electrical performance and reliability tests are performed on a plurality of chips simultaneously by energizing them for a predetermined period of time (i.e., wafer level burn-in testing). These tests may typically include LVS (layout versus schematic) verification, IDDq testing, etc. The resulting electrical signals generated from each chip or DUT (device under test) are captured and analyzed by automatic test equipment (ATE) having test circuitry to determine if a chip has a defect.

To facilitate wafer level burn-in testing and electrical signal capture from numerous chips on the wafer at the same time, DUT boards or probe cards as they are commonly known in the art are used. Probe cards are essentially printed circuit boards (PCBs) that contain a plurality of metallic electrical probes that mate with a plurality of corresponding electrical contacts or terminal formed on the wafer for the semiconductor chips. Each chip or die has a plurality of contacts or terminals itself which must each be accessed for testing. A typical wafer level test will therefore require that electrical connection be made between well over 1,000 chip contacts or terminals and the ATE test circuitry. Accordingly, precisely aligning the multitude of probe card contacts with chip contacts on the wafer and forming sound electrical connections is important for conducting accurate wafer level testing. Probe cards are typically mounted in the ATE and serve as an interface between the chips (dies) or DUTs and the test head of the ATE.

As semiconductor fabrication technology advances continue to be implemented, the critical dimension or spacing between electrical test contact pads and bumps (i.e. "pitch") on individual chips or dies formed on the semiconductor wafer continues to shrink. This makes it increasingly difficult to access these contacts properly for testing.

The present major trend in semiconductor fabrication is moving towards integration of 3D IC chip packages having vertically stacked chips and utilizing direct electrical interchip connections in lieu of other interconnect techniques such as wire bonds and chip edge interconnects. The dies in such 3D IC chip packages may include fine (small) pitch through substrate or silicon vias (TSVs) which are directly connected electrically to an adjoining stacked die. TSVs offer the possibility of higher density interconnects and shorter signal paths resulting in the possibility of forming die packages having smaller footprints. The TSVs in the dies may be terminated on the back side with very fine pitch microbump arrays for interconnection to adjacent stacked dies. The microbump arrays on the top die are also accessed for wafer level testing before the dies are assembled to a carrier substrate in the semiconductor device package. These microbump arrays may have a pitch (spacing) between the microbumps of 50 microns (µm) or less that must be accessed for die testing.

A technology bottleneck occurs that is associated with existing testing probe card designs and probing techniques that do not readily support testing such fine pitch microbump arrays encountered on dies that may be used in 3D IC chip packages. In some instances, direct probing of the microbumps by the test card probe tips may cause collapse or "crashing" of the microbumps as illustrated in FIG. 1 due to physical contact pressure and/or high current. This can result in permanent damage to the microbump, which adversely affects the integrity of the bump interconnect joint resulting in low bump joint yield and potential die rejection. In addition, the ability to properly access the fine pitch microbumps for testing is constrained by the larger pitch spacing of conventional testing card probe tips or needles as schematically illustrated in FIG. 2. All the die microbumps may therefore not be properly accessed for testing and signal transmission also resulting in low bump joint yield and die rejection.

An improved probing structure and method for fabricating the same is therefore desired for probing dies with microbump arrays.

BRIEF DESCRIPTION OF THE DRAWINGS

The features of the embodiments will be described with reference to the following drawings where like elements are labeled similarly, and in which:

FIGS. 7-12 are top views of probing units with different possible configurations or patterns of microbump clusters.

Figure 1:
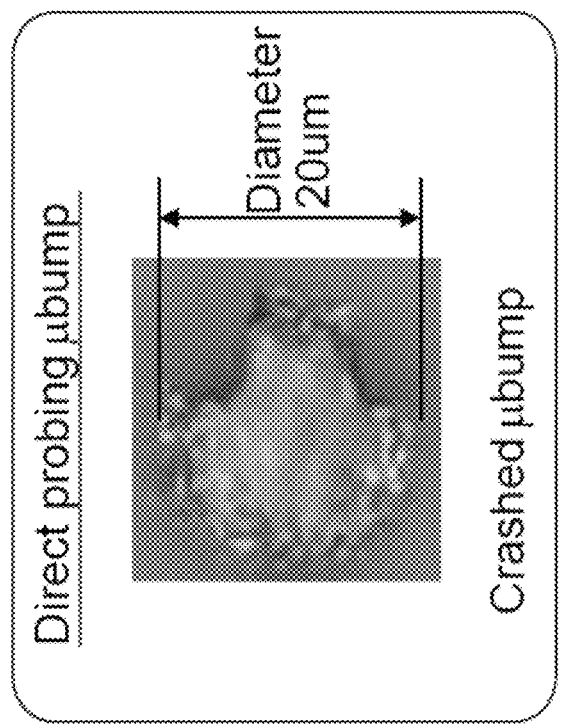
FIGS. 1 and 2 show existing die microbump probing constraints
Figure 2:
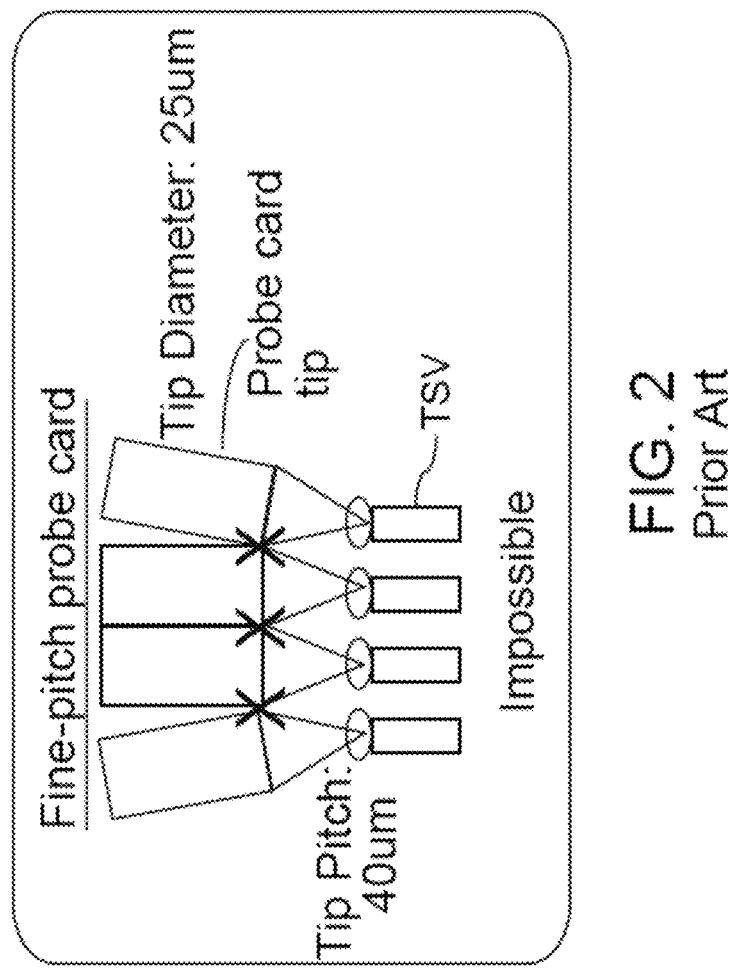

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Figure 3:
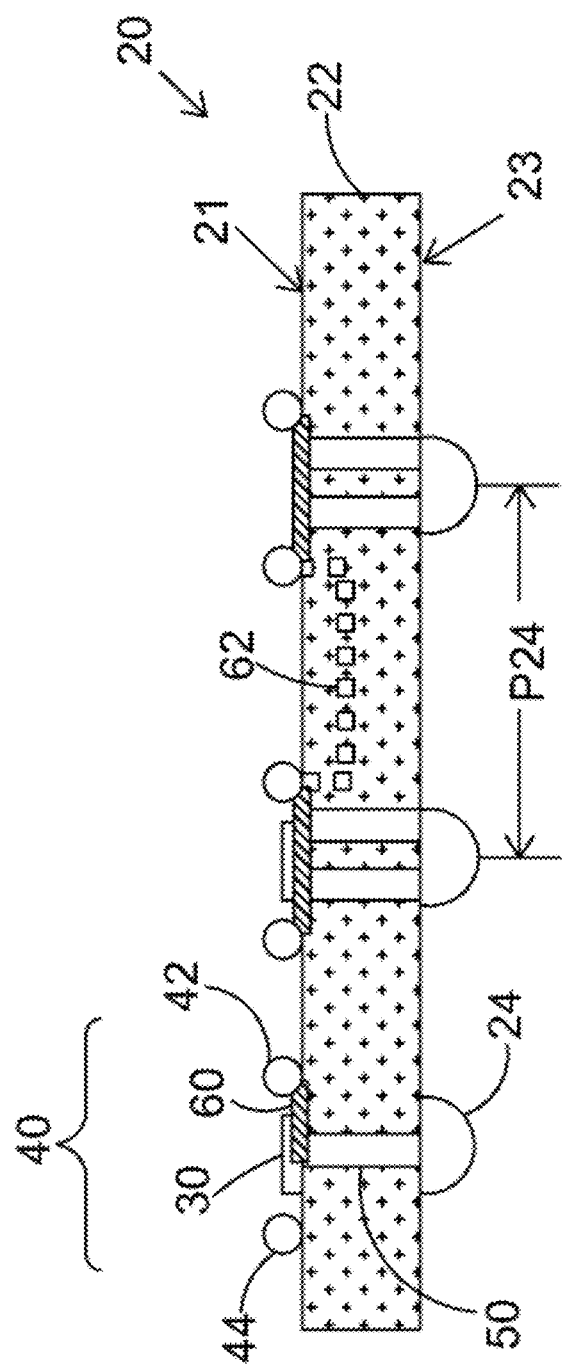
FIG. 3 is a partial cross-sectional side view of one embodiment of a die test probing interposer according to the present disclosure.

FIG. 3 shows a cross-section of one embodiment of a semiconductor probing structure for conducting wafer level die testing according to principles of the present disclosure. This embodiment is configured and adapted to enhance probing of the fine pitch microbump arrays encountered on dies used in 3D IC chip packages. Advantageously, the probing structure reduces or eliminates microbump crashing/collapse and relieves manufacturing/physical constraints on probe cards to produce probing tips or needles that can match the increasingly smaller fine pitch spacing of microbumps on 3D IC chip package dies.

In one embodiment, the probing structure may be an interposer 20 including a substrate 22 having a top side or surface 21 and an opposite bottom side or surface 23. In some embodiments, substrate 22 may be made of silicon, glass-silicon, or other suitable substrate materials commonly used in the semiconductor art. In one embodiment, the substrate 22 material used is silicon. Substrate 22 may have any suitable thickness to meet the requirement of the specific application intended. In one representative example, without limitation, substrate 22 may be a thickness of about and including 100 microns or less.

Bottom surface 23 of substrate 22 includes a plurality of conductive metallic solder bumps 24 for mating to corresponding conductive contacts provided on a conventional probe card (not shown) used for back-end-of-line (BEOL) wafer level die testing. Such probe cards generally include a testing printed circuit board (PCB) that contains conventional DUT (device under test) testing circuitry and active devices as will be well known to those skilled in the art. The testing PCBs are adapted for mounting on automatic test equipment (ATE) for performing wafer level DUT testing. The wafer testing circuitry is operative to apply an electrical load to a DUT on the wafer through bumps 24 and interposer 20 (see FIG. 5), and to receive and process return electrical signals from the DUT which in some embodiments may be associated with wafer level DUT burn-in performance and reliability tests.

Test probe cards are further described in commonly owned U.S. Pat. No. 8,033,012, which is incorporated herein by reference in its entirety.

Referring to FIG. 3, in some embodiments, bumps 24 may be C4 bumps having representative diameters without limitation of about 100-200 um. Bumps 24 may be made of any suitable material commonly used for C4 bumps and may be formed by any suitable conventional process known in the art used in fabricating flip chip connections (i.e. controlled collapse chip connections). In some embodiments, bumps 24 may be made of Cu or other suitable conductive metals or metal alloys such as tin and zinc.

A plurality of bumps 24 form an array of electrically conductive contacts which are arranged and configured on bottom surface 23 with a pitch spacing P24 selected for mating with and contacting a corresponding array of conductive contact pads having a similar pitch which are provided on a conventional testing probe card (not shown). In some embodiments, bumps 24 may have representative, but non-limiting pitch spacings P24 between bumps of about 100-200 um microns or more. Advantageously, the pitch spacing P24 of bumps 24 is not restricted by the correspondingly smaller pitch spacing P42 of the microbumps 42 formed on the opposite side of the interposer 20, as further described herein.

Figure 4:
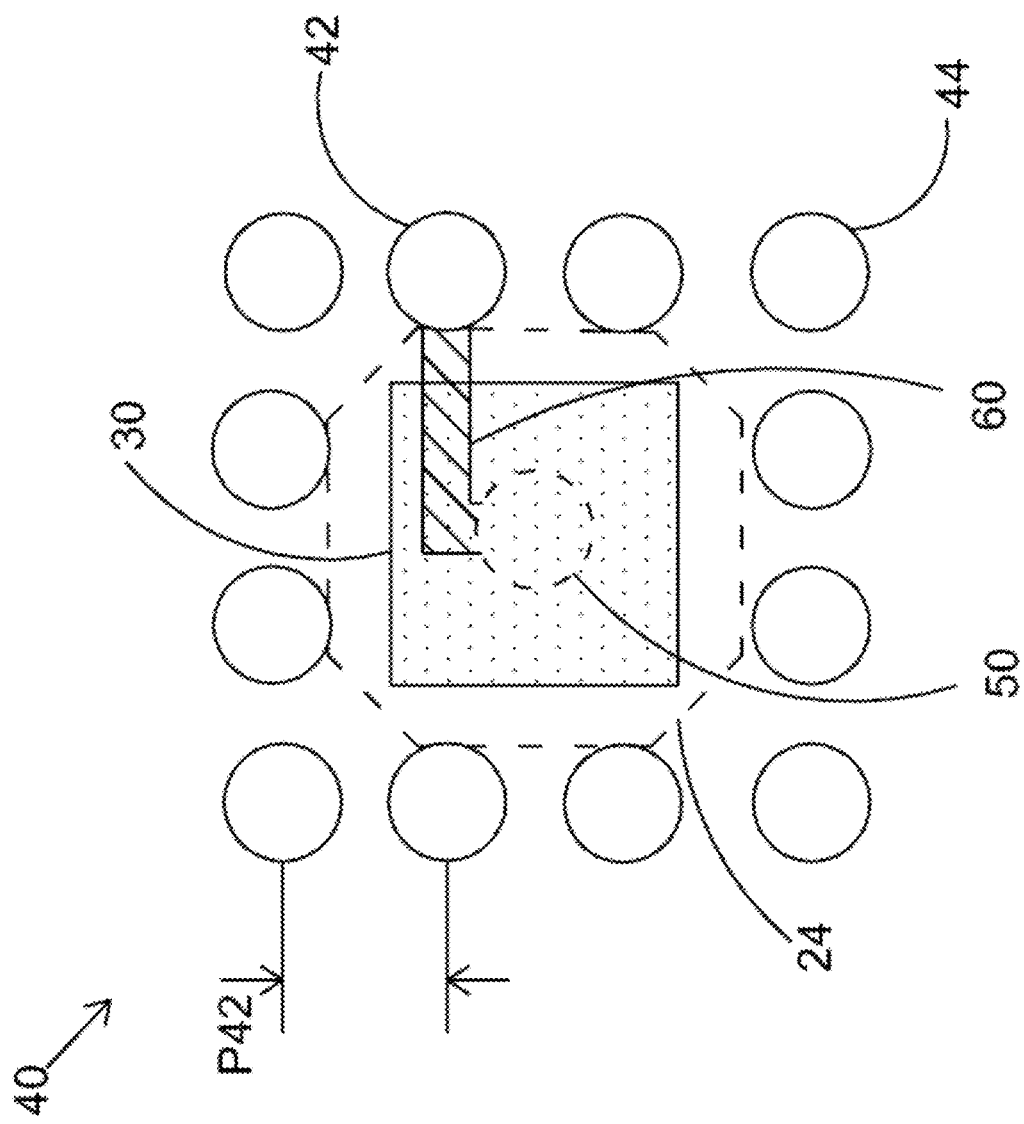
FIG. 4 is a top view of a probing unit of the interposer of FIG. 3.
Figure 5:
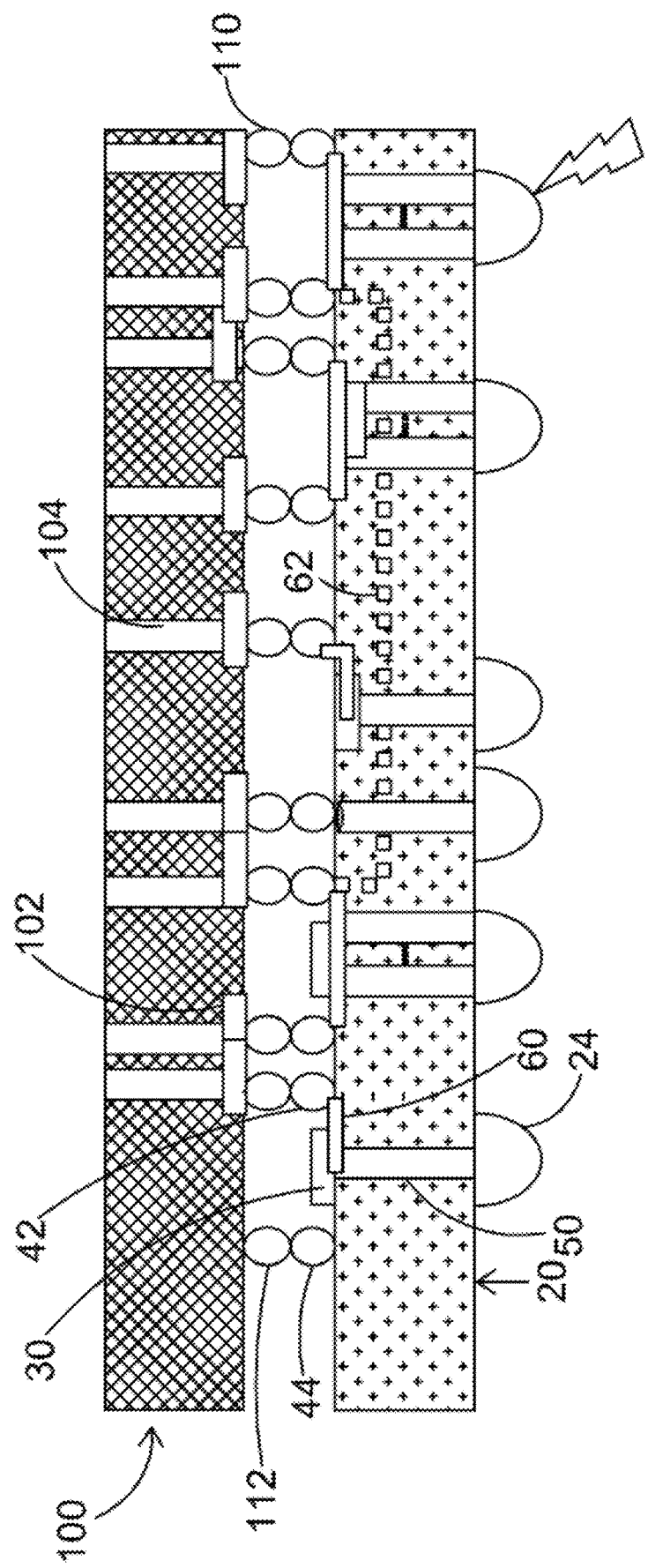
FIGS. 5 and 6 are partial cross-sectional side views of the probing interposer of FIG. 3 engaged with two possible embodiments of IC devices for performance testing.

Referring to FIGS. 3-5, top surface 21 of interposer 20 includes at least one or more electrically conductive probing units 40 for probing and testing dies 100 on the semiconductor wafer. Each probing unit 40 includes a central conductive metallic probing pad 30, at least one conductive metallic microbump 42 operably associated with the pad, and at least one conductive interconnect 60 electrically connecting the at least one microbump to the pad. In some embodiments, as shown, a probing pad 30 may be surrounded by a cluster of multiple microbumps 42 which are operably associated with the pad and may be arranged in various patterns and configurations in close proximity to the pad (best seen in FIG. 4 showing a top view of probing unit 40 in FIG. 3). Microbumps 42 are spaced apart from probing pad 30 and electrically isolated from the pad by the substrate 22 itself which has electrical insulating material properties. In one embodiment, microbumps 42 may be separated from pads 30 by a horizontal distance of about 20 microns. Interconnects 60 electrically connect one or more of the microbumps 42 to the probing pad 30. The microbumps 42 form an array of testing microbumps which are configured and arranged to mate with and access a corresponding array of die microbumps 110 formed on the die 100 for BEOL wafer level testing (see, e.g. FIG. 5), as further describe herein.

Probing pads 30 may be disposed on top surface 21 of interposer 20 or partially embedded in the top surface; examples of each possible embodiment being shown in FIG. 5. The probing pads 30 may have any suitable shape including without limitation square (as shown), rectangular, round, or others. Probing pads 30 may have any suitable thickness so long as the pads are sufficiently thick to form a good quality conductive pathway with microbumps 42 via interconnects 60. In one representative embodiment, without limitation, pad 30 may have a thickness of about 3-5 um.

Interconnects 60 may be in the form of one or more conductive metal tracings or leads of suitable configuration formed in or near top surface 21 of interposer 20 for connecting the microbumps 42 to probing pad 30. The number and configuration of interconnects 60 used will depend on the number of microbumps 42 and electrical connections desired between the microbumps and pad 30, as further described herein.

Probing pads 30 and interconnects 60 may be formed by any suitable method process commonly used in the semiconductor fabrication art for forming conductive bond pads and redistribution layer (RDL) leads or pathways, such as for example without limitation conventional damascene processes including a combination of photolithography using patterned photoresist, etching, and metal deposition or plating steps. In some representative embodiments, without limitation, the probing pads 30 may be made of Cu or other suitable conductive metals such as aluminum. The interconnects 60 may be similarly made of Cu or other suitable conductive metals such as aluminum.

Referring to FIGS. 3 and 4, microbumps 42 may be any suitable type of bump including without limitation solder bumps, pillar bumps, stud bumps, etc. In some embodiments, the microbumps 42 may have a representative diameter without limitation of about 20 microns and pitch spacing P42 of about 50 microns or less. In some embodiments, the pitch spacing P42 may be about 40 microns. The pitch P42 of microbumps 42 matches the pitch of corresponding mating microbumps 110 on die 100 (shown in FIG. 5) as needed which will be accessed and engaged for performing die testing.

Microbumps 42 may be formed onto interconnects 60 or directly onto substrate 22 via metal adhesion surface preparation.

Microbumps 42 may be made of any suitable conductive metal or metal alloy commonly used for solder microbumps. In some embodiments, microbumps 40 may be made of Cu, CuSn, SnZn, etc. and may be the same material as C4 bumps 24.

Microbumps 42 and C4 bumps 24 may be formed by any suitable conventional MEM or semiconductor fabrication processes well known in the art for forming solder microbumps and bumps. Such processes may include, for example without limitation, evaporation, electroplating, printing, and stud bumping.

In some embodiments, probing units 40 may include a combination of electrically active microbumps 42 and inactive microbumps 44. Active microbumps 42 are electrically connected to probing pad 30 via interconnects 60 and operable to transmit and receive electrical test signals. The electrically inactive microbumps 44 are not electrically connected to pads 30 or any other conductive structure provided in interposer 20, and are therefore are electrically isolated and inactive forming no part of the active die testing electrical circuit. Inactive microbumps 44 assist with the microbumps joining process in which the active microbumps 42 are placed into engagement with active microbumps 110 on die 100 for testing. The inactive microbumps 44 help to distribute the contact pressure over a greater surface area of microbumps, thereby reducing the contact pressure between the abutted microbumps on the interposer 20 and die 100. Each electrically inactive microbump 44 engages a corresponding mating inactive microbump 112 disposed on die 100 which may also be unconnected to any electrically active conductive path formed in the die and thus provided to merely assist with the engagement. Engagement between the inactive microbumps 44 and 112 protects the integrity of the active microbumps 42 and 110 to prevent or minimize damage to the active microbumps.

Referring to FIGS. 3 and 4, through substrate vias or TSVs 50 extend vertically through substrate 22 of interposer 20 and electrically connect probing pads 30 near top surface 21 of interposer 20 to bumps 24 on the bottom surface 23. In some embodiments, the TSVs 50 may be through silicon vias where a silicon substrate material is used. TSVs 50 may be made of any suitable conductive material commonly used in the art for such vias, including without limitation tungsten, copper, nickel, or alloys thereof. In some representative embodiments, TSVs 50 may have a representative diameter, without limitation, of about 5 to 12 microns depending on the design requirement and process used to form the TSVs.

In some embodiments, at least one TSV 50 is provided for each bump 24 and corresponding probing pad 30 as shown in the left probing unit 40 embodiment in FIG. 3. In other embodiments, two or more TSVs 50 may be provided as shown in the center and right probing unit 40 embodiments in FIG. 3. This latter arrangement provides a redundant TSV 50 and conductive signal pathway which enhances electrical test signal transmission through the interposer 20 and also increases bump joint yield in a 3D IC applications in the event one of the TSVs 50 should possibly be damaged or fail during wafer level die testing.

It will be appreciated that the combination of probing pad 30, interconnects 60, and microbumps 42 of each probing unit 40 convert the larger/wider pitch P24 of bumps 24 on bottom surface 23 of the interposer 20 intended to mate with the conventional larger pitch of contacts on the testing probe card, to a smaller/finer pitch P42 of microbumps 42 on the top surface 21 of the interposer intended to mate with the correspondingly smaller pitch spacing of microbumps 110, 112 on die 100 to be accessed for testing. Advantageously, this eliminates manufacturing and practical constraints on the probe card itself to produce probe cards having probing tips or needles with an extremely fine pitch (e.g. 50 microns or less) necessary to access the correspondingly fine pitch microbump arrays on dies used for 3D IC chip packages, which may be difficult to achieve in practice.

Figure 6:
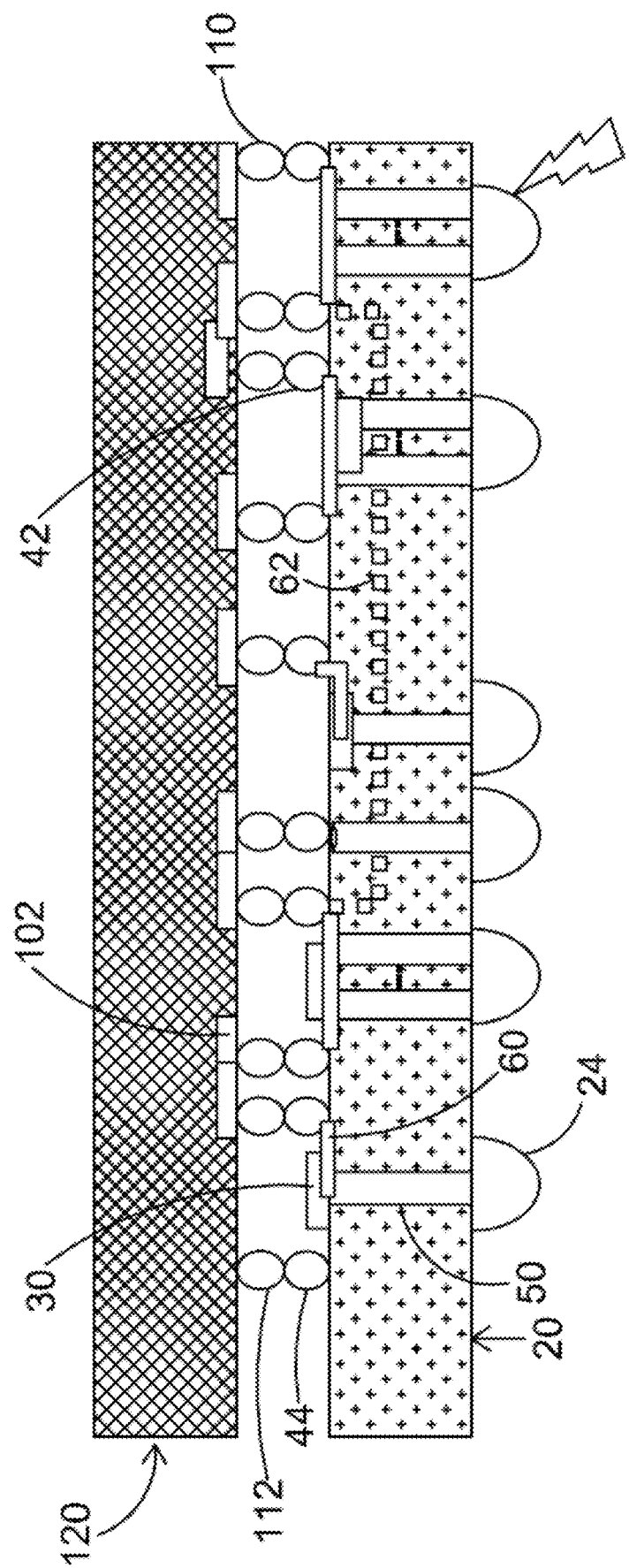
Figure 7:
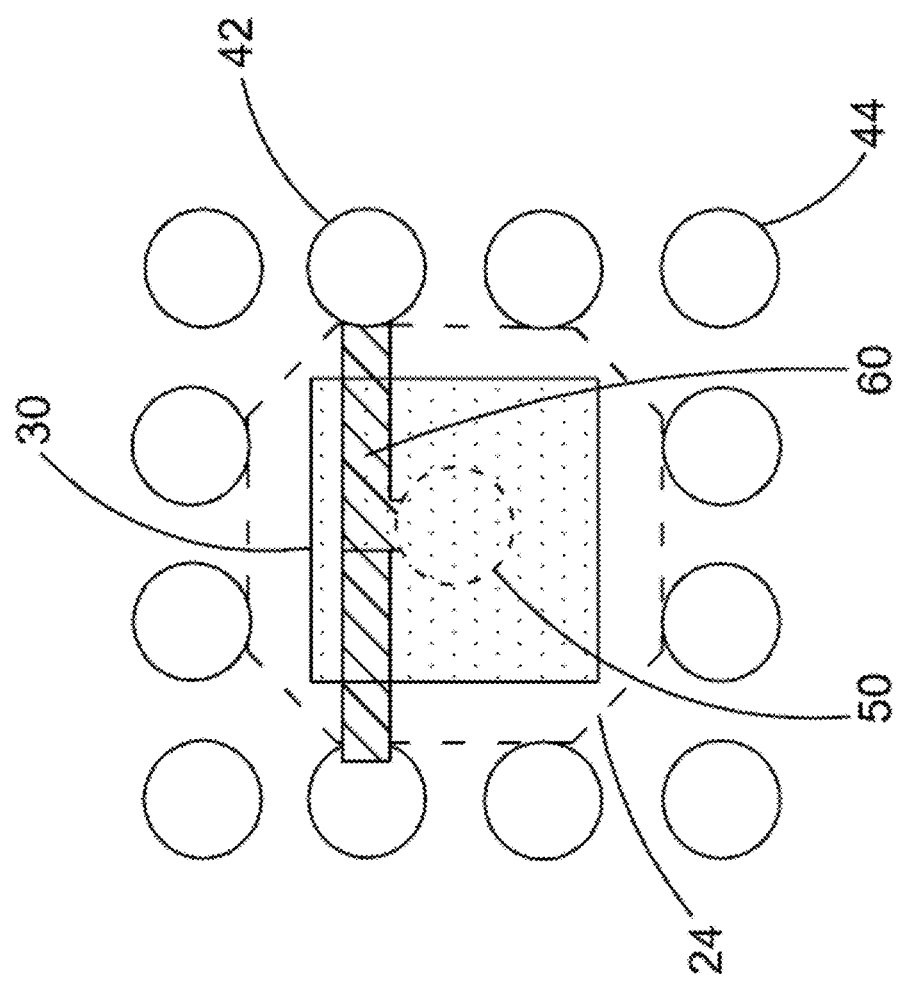
Figure 8:
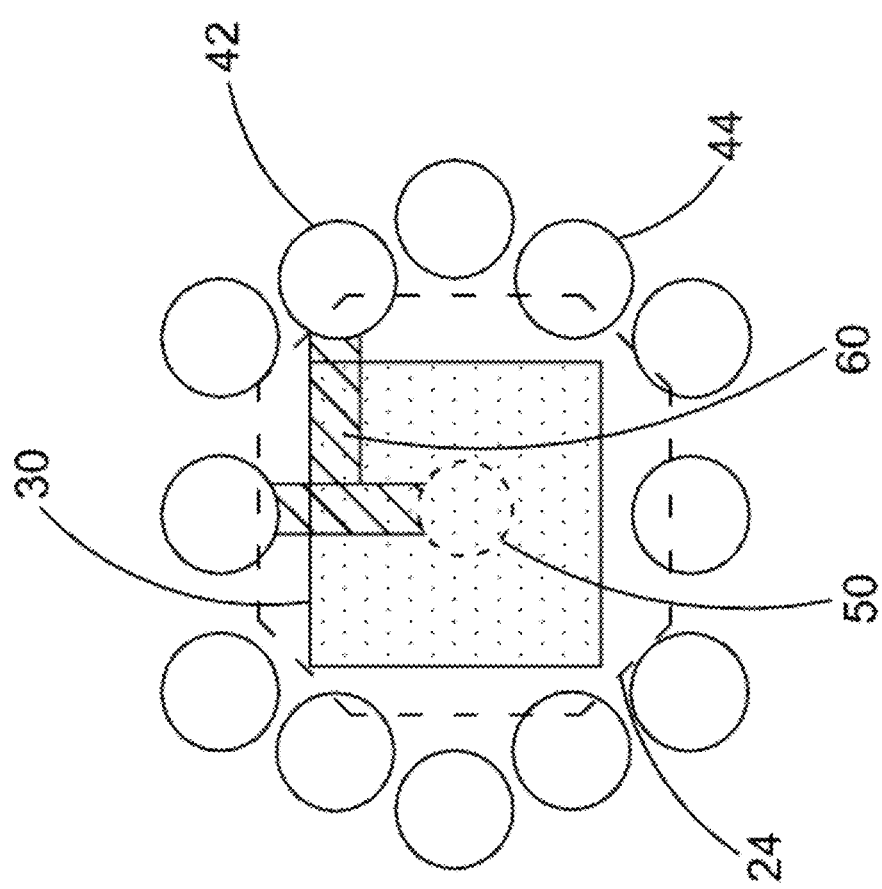
Figure 9:
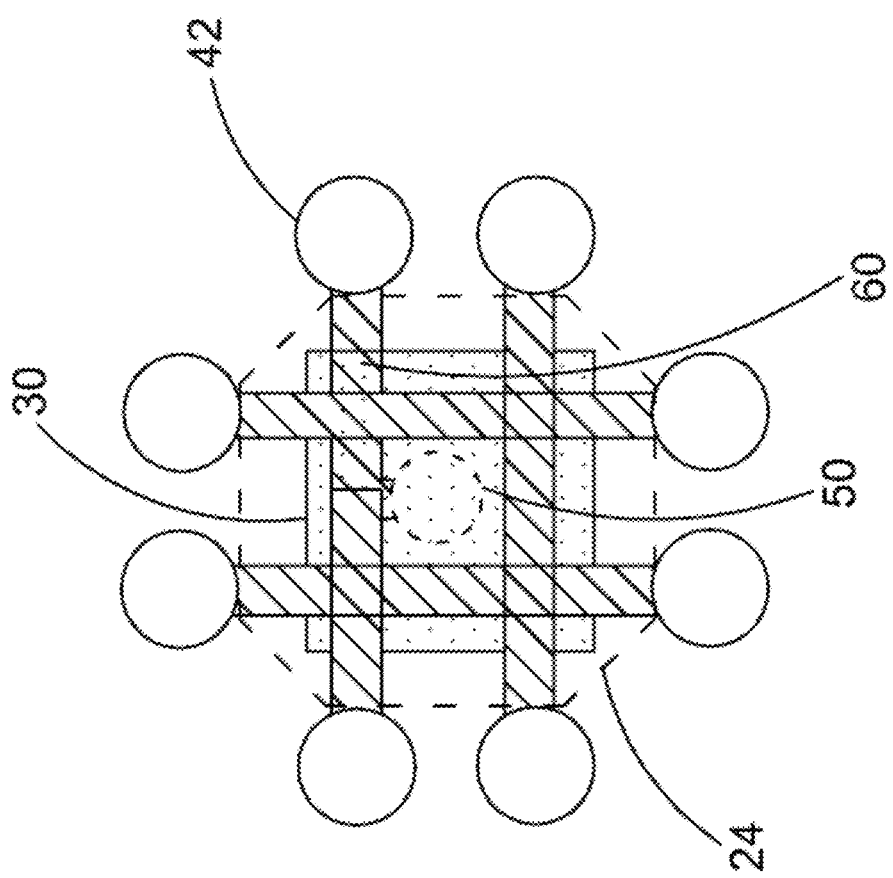
Figure 10:
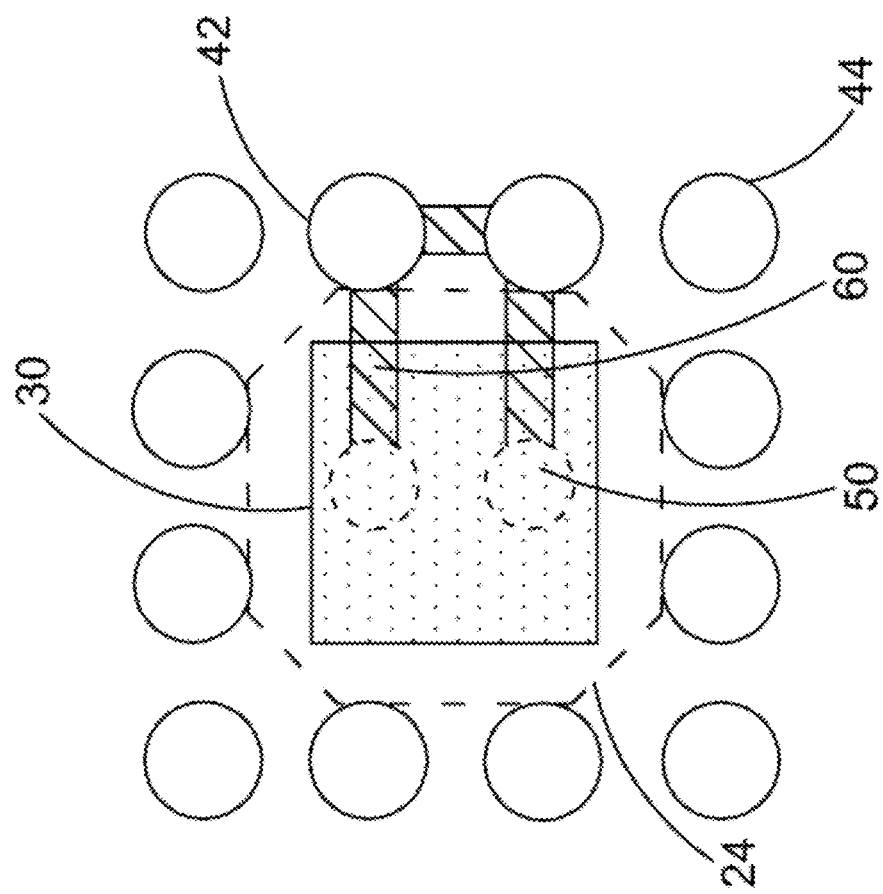

Any number of active microbumps 42 may be electrically connected to probing pad 30 by one or more interconnects 60 to meet the intended testing application and requirements for probing die 100 or 120 (shown in FIGS. 5 and 6. Die 100 is referred to in the art as a 3D stacked die with TSVs for further upward stacking of more dies, whereas die 120 is referred to as a 2.5D stacked die which does not have TSVs. The number of interconnects 60 used may in part be dictated by the capacity of the testing signal circuit required for a given application. For example, each microbump 42 may have a current rating of 100 mA (milliamps). For an electrical testing signal transmission requiring a circuit with a maximum current capacity of 200 mA, two microbumps 42 each rated at 100 mA would be required which may be interconnected to probing pad 30 as shown in the signal type probing unit 40 configuration depicted in FIG. 4. For power domain testing circuits, a circuit capable of transmitting 800 mA may be required. Accordingly, eight microbumps 42 each rated at 100 mA would be required resulting in a possible power type probing unit 40 configuration as shown in FIG. 9. Accordingly, it will be appreciated that one skilled in the art may configure a probing unit 40 to provide any suitable number of active microbumps 42 and interconnect 60 pattern required to achieve the desired circuit amperage capacity and layout.

Several exemplary embodiments of probing units 40 illustrating some possible, but non-limiting examples of interconnect 60 and microbump 42, 44 cluster patterns that might be used are shown in FIGS. 7-12. Each probing unit 40 includes a pad 30 and an associated cluster of microbumps 42, 44 surrounding the pad and in relatively close proximity thereto being concentrically arranged around the pad and corresponding conductive bump 24 (shown in dashed lines) disposed on the opposite side 23 of the interposer substrate 22. The clusters of microbumps 42, 44 may form innumerable different patterns including quadrangles, hexagons, octagons, and other shapes as desired for a specific application. In the embodiments shown, the microbumps 44 not connected to probing pad 30 via an interconnect 60 are inactive microbumps described elsewhere herein which distribute the contact pressure between the interposer microbumps and die microbumps 110, 112 over a larger surface area to prevent damaging the die microbumps when the interposer 20 is engaged with the die 100 for testing.

As shown in FIG. 5, interposer 20 according to embodiments of the present disclosure may be used to engage and test dies 100 utilizing TSVs 104 and active solder microbumps 110, which in some embodiments may be formed on conventional UBM (under bump metallization) pads 102. Microbumps 110 may electrically coupled via the UBM pads 102 to conventional top metal layer aluminum RDL leads (not shown). Die 100 represents the top die in the IC chip package. Interposer 20 may also be used for testing dies 120 without TSVs and utilizing other conventional metallization interconnect structures such as vias and trenches as shown in FIG. 6.

In some embodiments, interposer 20 includes an array of multiple probing units 40 having microbumps 42, 44 configured and arranged for mating with a corresponding array of microbumps 110, 112 formed on a device under test (DUT) such as die 100. The probing units may include a combination of probing units 40 having numerous different configurations of microbumps 42, interconnects 60, and TSVs 50 as shown in FIGS. 3 and 5-6. This may include any of the possible probing unit 40 patterns shown in FIGS. 4 and 7-12, and others as needed to suit the requirements of the particular application intended and configuration of microbumps 110, 112 on the die 100. In addition, as shown in FIGS. 3 and 5-6, additional conductive metallic tracings 62 may be provided to electrically interconnect one probing unit 40 to one or more other probing units 40, such as for example either through one microbump 42 interconnected to another microbump 42, a pad 30 interconnected to a microbump 42, and/or a pad 30 interconnected directly to another pad 30.

To test either dies 100 or 120 shown in FIGS. 5 and 6, interposer 20 is first moved into engagement with the dies. Microbumps 42, 44 on interposer 20 are mated to and abutted against corresponding microbumps 110, 112 on dies 100 or 120 as shown. Probing pads 30 are spaced apart from conductive microbumps, pads, or other electrically active conductive structures on dies 100, 120 so that the active die microbumps 110 coupled to the electrical circuit in the die are not directly accessed for testing, but rather accessed through testing signals transmitting from active microbumps 42 on each probing unit 40 to corresponding active die microbumps 110 to prevent crashing or damage to the die microbumps. Conventional BEOL testing may now be performed by applying electrical test signals to bumps 24 (see electrical arrows). The test signals are transmitted in a sequential path through (in order) bumps 24, TSVs 50, interconnects 60, and active microbumps 42 all disposed on the interposer 20, and then to the active microbumps 110 on die 100 or 120.

In some embodiments, the interposer 20 may be permanently joined to the dies 100 or 120 via conventional microbump-to-microbump joints so that the interposer is incorporated into the final chip package as shown in FIGS. 5 and 6. Conventional solder reflow, ultrasonic, or other suitable methods commonly used in the art for making microbump joints may be employed to couple the microbumps together. It should noted that some probing steps may be performed before or after the microbump joint is completed. In addition, in some embodiments after top die stacking onto the interposer, the dies may occupy only a portion of the total interposer area.

As shown in FIGS. 5 and 6, in some embodiments there is no direct contact between probing pads 30 and any electrically conductive structures on dies 100 or 120. The pads 30 are spaced apart from the mating surface of dies 100, 120 when in a testing position as shown. Accordingly, the pads 30 function as a conductive hub for receiving and distributing electric current to and from microbumps 42 electrically coupled to the pad via interconnects 60. The mating microbumps 110 on die 100 or 120 are probed and tested via a bump-to-bump contact with microbumps 42 on interposer 20. The pads 30 therefore are not directly coupled electrically to dies 100, 120 or microbumps 110 thereon, but rather indirectly through microbumps 42. Advantageously, this approach allows the current to be more carefully controlled to microbumps on the dies thereby minimizing the chance of crashing/collapse and damage to the microbumps which increases bump joint yield.

A method for forming a probing interposer 20 will now be described with reference to FIGS. 3 and 4. In one, the method or process includes providing a substrate 22, forming a plurality of TSVs 50 through the substrate, filling the TSVs with an electrically conductive material, and forming an array of bumps 24 on a first side 23 wherein the bumps are disposed on the bottom of and electrically coupled to the TSVs. In some embodiments, the bumps 24 may be disposed on conductive pads formed first on the TSVs 50. The bumps 24 may be C4 bumps in some embodiments having a first pitch spacing P24.

The method or process continues by forming at least one probing unit 40 on a second side 21 of the substrate 22. This includes forming probing pads 30 on top of TSVs 50 and interconnects 60 on the second side 21 of the substrate 22, in any order. Each pad 30 may be formed on a single TSV 50 which is conductively connected in turn to a corresponding bump 24, or in some embodiments a pad 30 may be connected to at least two TSVs 50 which are connected in turn to a single bump 24 to provide a redundant testing signal pathway from the bump to the pad. An array of active microbumps 42 and inactive microbumps 44 are next formed on the second side 21. At least one of the microbumps 42 in each probing unit 40 is disposed in contact with and electrically coupled to a corresponding interconnect 60, which in turn is coupled to a corresponding probing pad 30.

It will be appreciated that interposer 20 may include other various conductive interconnect structures beyond those shown, or in some possible embodiments may be active and include one or more active electrical devices.

In one embodiment, a semiconductor probing structure for performing wafer level die testing includes: a substrate having a first surface and a second surface; a plurality of through substrate vias extending between the first and second surfaces; a plurality of bumps formed on the first surface of the substrate, each bump being conductively coupled to one of the vias; and a plurality of probing units disposed on the second surface of the substrate, each probing unit including a probing pad conductively coupled to one of the vias, at least one microbump operably associated with the pad, and at least one conductive interconnect conductively coupling the microbump to the pad, the microbump being arranged to mate with a corresponding microbump on a device under test. Test signals from a probe card applied to the bumps are transmitted through the microbump to the die microbump, thereby indirectly probing the die microbump. In one embodiment, the bumps are C4 bumps having a pitch spacing which is larger than the pitch spacing of the microbumps.

In another embodiment, a semiconductor probing structure for performing die testing includes: a substrate having a first surface and a second surface; a plurality of through substrate vias extending between the first and second surfaces; a plurality of bumps formed on the first surface of the substrate, each bump being conductively coupled to at least one of the vias; and a plurality of probing units disposed on the second surface of the substrate, each probing unit including a probing pad conductively coupled to at least one of the vias and a plurality of microbumps operably associated with and arranged around the pad in relative proximity thereto, at least one of the microbumps being conductively coupled to the pad and electrically active, the plurality of microbumps being arranged to mate with a corresponding array of die microbumps on a device under test.

In yet another embodiment, a semiconductor probing structure for performing die testing includes: an interposer including a substrate having a first surface and a second surface; a plurality of through substrate vias extending between the first and second surfaces; a plurality of bumps formed on the first surface of the substrate, each bump being conductively coupled to at least one of the vias; and a plurality of probing units disposed on the second surface of the substrate, each probing unit including a probing pad conductively coupled to at least one of the vias and a cluster of multiple microbumps operably associated with and arranged around the pad in relative proximity thereto, at least one of the microbumps being conductively coupled to the pad and electrically active, the plurality of microbumps being arranged to mate with a corresponding array of die microbumps on a device under test. The bumps and microbumps each have a respective pitch spacing, the pitch spacing of the microbumps being smaller than the pitch spacing of the bumps.

In some embodiments, at least one of the probe pads in any of the foregoing embodiments may be conductively coupled to a corresponding bump by at least two vias to provide a redundant testing signal pathway. The bumps may be C4 bumps in some embodiments.

While the foregoing description and drawings represent possible exemplary embodiments of the present disclosure, it will be understood that various additions, modifications and substitutions may be made therein without departing from the spirit and scope and range of equivalents of the accompanying claims. In particular, it will be clear to those skilled in the art that the present disclosure may be embodied in other forms, structures, arrangements, proportions, sizes, and with other elements, materials, and components, without departing from the spirit or essential characteristics thereof. In addition, numerous variations in the methods/processes and/or control logic as applicable described herein may be made without departing from the spirit of the disclosure. One skilled in the art will further appreciate that the disclosure may be used with many modifications of structure, arrangement, proportions, sizes, materials, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being defined by the appended claims and equivalents thereof, and not limited to the foregoing description or embodiments. Rather, the appended claims should be construed broadly, to include other variants and embodiments of the disclosure, which may be made by those skilled in the art without departing from the scope and range of equivalents of the disclosure.

What is claimed is:

1. A probing structure for semiconductor die testing comprising:
   a substrate having a first surface and a second surface;
   a plurality of through substrate vias (TSVs) extending between the first and second surfaces;
   a plurality of bumps disposed on the first surface of the substrate for engaging needles or tips of a testing probe head, each of the plurality of bumps connected with at least one of the plurality of TSVs;
   a probing pad being metallic, contacting the second surface of the substrate, and electrically connected to at least one of the plurality of TSVs,
   a plurality of microbumps surrounding the probing pad, and
   at least one interconnect connected to the probing pad, wherein at least one of the plurality of microbumps is electrically coupled to the probing pad through the at least one interconnect,
   wherein the probing pad, the plurality of microbumps, and the at least one interconnect are disposed on the second surface of the substrate.

2. The probing structure of claim 1, wherein the plurality of microbumps comprise at least one active microbump electrically coupled to the probing pad.

3. The probing structure of claim 1, wherein the plurality of microbumps comprise at least one inactive microbump conductively isolated from the probing pad.

4. The probing structure of claim 1, wherein the plurality of microbumps comprise at least four microbumps.

5. The probing structure of claim 1, wherein the plurality of microbumps are arranged in a pattern having a shape of quadrangle, hexagon, or octagon.

6. The probing structure of claim 1, wherein at least two of the plurality of microbumps are electrically coupled to the probing pad via an interconnect.

7. The probing structure of claim 1, wherein the plurality of microbumps are concentrically arranged around and proximate to the probing pad.

8. The probing structure of claim 1, further comprising a second interconnect electrically coupling a second one of the plurality of microbumps to the probing pad.

9. The probing structure of claim 1, wherein each probing pad is electrically connected to at least two of the through substrate vias.

10. The probing structure of claim 1, wherein the plurality of microbumps include eight microbumps concentrically arranged around the probing pad in a shape of octagon, and electrically coupled to the probing pad through two parallel pairs of interconnects.

11. The probing structure of claim 1, wherein the plurality of microbumps include eight microbumps arranged around the probing pad in a shape of square, and electrically coupled to the probing pad through two interconnects.

12. The probing structure of claim 1, wherein the plurality of microbumps further comprise 12 microbumps arranged around the probing pad in a shape of square, including two microbumps electrically coupled to the probing pad through one interconnect and ten electrically isolated from the probing pad.

13. A method of making a probing structure for semiconductor die testing comprising:
   providing a substrate having a first surface and a second surface;
   forming a plurality of through substrate vias (TSVs) extending between the first and second surfaces;
   forming a plurality of bumps on the first surface of the substrate, each of the plurality of bumps connected with at least one of the plurality of TSVs;

forming a probing pad being metallic, contacting the second surface of the substrate, and electrically connected to at least one of the plurality of through substrate vias, forming a plurality of microbumps surrounding the probing pad, and connecting at least one of the plurality of microbumps to the probing pad through the at least one interconnect, wherein at least one of the plurality of microbumps is electrically coupled to the probing pad, wherein the probing pad, the plurality of microbumps, and the at least one interconnect are formed on the second surface of the substrate.

14. The method of claim 13, wherein the plurality of microbumps comprise at least one active microbump electrically coupled to the probing pad, and at least one inactive microbump conductively isolated from the probing pad.

15. The method of claim 13, wherein the plurality of microbumps are arranged in a pattern having a shape of quadrangle, hexagon, or octagon.

16. The method of claim 13, wherein the plurality of through substrate vias (TSVs) are filled with tungsten, copper, nickel, or an alloy thereof.

17. A method for semiconductor die testing comprising:
providing a probing structure, the probing structure comprising:
  a substrate having a first surface and a second surface;
  a plurality of through substrate vias (TSVs) extending between the first and second surfaces;
  a plurality of bumps disposed on the first surface of the substrate for engaging needles or tips of a testing probe head, each of the plurality of bumps connected with at least one of the plurality of TSVs;
  a probing pad being metallic, contacting the second surface of the substrate, and electrically connected to at least one of the plurality of TSVs,
  a plurality of microbumps surrounding the probing pad, and
  at least one interconnect connected to the probing pad, wherein at least one of the plurality of microbumps is electrically coupled to the probing pad through the at least one interconnect, wherein the probing pad, the plurality of microbumps, and the at least one interconnect are disposed on the second surface of the substrate;
contacting the probing structure with a die having a plurality of microbumps on a bottom surface, the second surface of the substrate of the probing structure in contact with the bottom surface of the die; and
applying electrical signals onto at least one of the plurality of bumps on the first surface of the substrate.

18. The method of claim 17, wherein the plurality of microbumps in the probing structure comprise at least one active microbump electrically coupled to the probing pad, and at least one inactive microbump conductively isolated from the probing pad.

19. The method of claim 18, wherein the at least one active microbump is in contact with at least one of the plurality of microbumps on the bottom surface of the die.

20. The method of claim 18, wherein the electrical signals are transmitted to at least one of the plurality of microbumps on the bottom surface of the die, through at least one of the plurality of TSVs, and at least one of the plurality of microbumps in the probing structure.

\* \* \* \* \*